US007268717B2

(12) United States Patent
Baek

(10) Patent No.: US 7,268,717 B2
(45) Date of Patent: Sep. 11, 2007

(54) DISPLAY DRIVER CIRCUIT, CURRENT SAMPLE/HOLD CIRCUIT AND DISPLAY DRIVING METHOD USING THE DISPLAY DRIVER CIRCUIT

(75) Inventor: Jong-Hak Baek, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/340,705

(22) Filed: Jan. 27, 2006

(65) Prior Publication Data

US 2006/0170629 A1 Aug. 3, 2006

(30) Foreign Application Priority Data

Jan. 31, 2005 (KR) ..................... 10-2005-0008629

(51) Int. Cl.
*H03M 1/66* (2006.01)

(52) U.S. Cl. ...................................................... 341/144

(58) Field of Classification Search ................ 341/144, 341/150, 153, 133, 138; 345/89, 98, 590
See application file for complete search history.

(56) References Cited

U.S. PATENT DOCUMENTS 5,614,922 A * 3/1997 Kawaguchi et al. .......... 345/89
6,747,626 B2 * 6/2004 Chiang ........................ 345/98
2004/0174283 A1 * 9/2004 Sun ............................ 341/136

FOREIGN PATENT DOCUMENTS

JP 2000-081920 3/2000
JP 2003-216109 7/2003
JP 2004-077743 3/2004
JP 2004-093774 3/2004

* cited by examiner

*Primary Examiner*—Brian Young
(74) *Attorney, Agent, or Firm*—Harness, Dickey & Pierce, P.L.C.

(57) ABSTRACT

A display driver circuit may include, a shift register configured to shift a first clock signal to generate at least one second clock signal, a digital-to-analog conversion unit configured to convert digital gray-scale data to an analog gray-scale signal, a first sample/hold output circuit configured to sample/hold the analog gray-scale signal in response to the at least one second clock signal, and configured to provide the sampled/hold analog gray-scale signal to a plurality of first channels in response to a first latch enable signal, and a second sample/hold output circuit configured to sample/hold the analog gray-scale signal in response to the second clock signal, and configured to provide the sample/hold analog gray-scale signal to a plurality of second channels in response to a second latch enable signal.

22 Claims, 5 Drawing Sheets

DISPLAY DRIVER CIRCUIT, CURRENT SAMPLE/HOLD CIRCUIT AND DISPLAY DRIVING METHOD USING THE DISPLAY DRIVER CIRCUIT

CLAIM FOR PRIORITY

A claim of priority is made to Korean Patent Application No. 2005-8629, filed on Jan. 31, 2005 in the Korean Intellectual Property Office, the entire contents of which are hereby incorporated by reference.

BACKGROUND OF THE INVENTION

1. Field of the Invention

Example embodiments of the present invention relate to a display driver circuit for a flat display panel and a display driving method using the same. More particularly, example embodiments of the present invention relate to a display driver circuit, a current sample/hold circuit, and a display driving method using the display driver circuit.

2. Description of the Related Art

A liquid crystal display (LCD) and a plasma display panel (PDP) are the two most common type of flat panel displays. Recently, an organic light emitting diode (OLED) display, which features higher contrast and/or quicker response time, is a type of display that has gain increased attention.

In order to implement a display driver circuit capable of supporting higher definition, a number of bits for a gray level should be increased. Accordingly, each of channels in the display driver circuit should process more data; however, the number of channels may increase as a size of a display panel increases.

A conventional display driver circuit, which may include a digital-to-analog converter (DAC) corresponding to each one of the channels, may be limited in its function as the number of the gray-scale bits and the number of the channels increases. Therefore, a display driver circuit capable of supporting an increased number of gray-scale bits and increased number of channels may be required.

FIG. 1 is a block diagram illustrating a conventional display driver circuit 100.

Referring to FIG. 1, the conventional display driver circuit 100 may include a shift register 110, a data interface circuit 120, a data latch circuit 130, a reference bias circuit 140, and/or an output circuit 150.

The shift register 110 may receive a clock signal CLK and output a shifted clock signal. The data interface circuit 120 may receive and process display data. The data latch circuit 130 may receive output signals from the data interface circuit 120 in response to the shifted clock signal output from the shift register 110, and output the display data to each of a plurality of channels in response to a latch enable signal LE. The reference bias circuit 140 may provide a reference value. The output circuit 150 may receive the output signals from the data latch circuit 130, convert the received output signals to analog output signals, and output the analog output signals to each of the plurality of channels.

In further detail, the shift register 110 may receive the clock signal CLK to shift the clock signal CLK to a left direction in response to a left input start pulse or shift the clock signal CLK to a right direction in response to a right input start pulse; the shift register 110 may store the shifted clock signal and output the shifted clock signal.

The data interface circuit 120 may receive and process the received display data corresponding to each of the plurality of channels, and output the processed display data to the data latch circuit 130.

The data latch circuit 130 may sample/hold output signals received from the data interface circuit 120 based on the shifted clock signal of the shift register 110. When the data latch circuit 130 receives all of the output signals of the data interface circuit 120, the data latch circuit 130 may output the sampled/held output signals to each of the plurality of channels based on the latch enable signal LE.

The output circuit 150 may receive the output signals of the data latch circuit 130. Each of a plurality of digital-to-analog converters (DAC) 152 included in the output circuit 150 may convert the corresponding output signals of the data latch circuit 130 to analog output signals, and output the analog output signals to the plurality of a plurality of channels via each of channel output circuits 154 also included in the output circuit 150.

FIG. 2 is a timing diagram to explain operations of the display driver circuit 100 shown in FIG. 1.

Referring to FIG. 2, when shift clocks CLK 1 through CLK Q corresponding to the number of channels N are turned on, a latch enable signal LE is activated on and output signals are output to all of a plurality of channels OUT 1 through OUT N.

If a size of a display panel becomes larger, the number of channels increases, and the number of DACs included in each of the channels also increases, and a chip size of the display driver circuit 100 also increases.

In addition, in order to implement high definition, a gray level may increase; thus, the number of processing bits of the DAC may also increase. As a result, a chip size of the DAC included in each of the channels may also increase, and the chip size of the display driver circuit 100 increases. If a display panel supporting a large scale panel and high definition is implemented using the conventional display driver circuit 100 shown in FIG. 1, a size of the display driver circuit 100 may be relatively large.

SUMMARY OF EXAMPLE EMBODIMENTS OF THE INVENTION

Example embodiments of the present invention may provide a display driver circuit with a smaller chip size capable of supporting a larger scaled and higher definition panel. Example embodiments of the present invention also may provide a display driving method capable of supporting a larger scaled high definition panel. Example embodiments of the present invention may also provide a current sample/hold circuit capable of performing faster sampling on an analog gray-scale signal, and capable of reducing a mismatch between a sampling value and a holding value of the analog gray-scale signal.

In an example embodiment of the present invention, a display driver circuit, may include a shift register configured to shift a first clock signal to generate at least one second clock signal, a digital-to-analog conversion unit configured to convert digital gray-scale data to an analog gray-scale signal, a first sample/hold output circuit configured to sample/hold the analog gray-scale signal in response to the at least one second clock signal, and configured to provide the sampled/hold analog gray-scale signal to a plurality of first channels in response to a first latch enable signal, and a second sample/hold output circuit configured to sample/hold the analog gray-scale signal in response to the second clock signal, and configured to provide the sample/hold analog gray-scale signal to a plurality of second channels in response to a second latch enable signal.

In an example embodiment of the present invention, a current sample/hold circuit, may include a sample/hold unit configured to receive an analog gray-scale signal in response to a clock signal, and adapted to output the analog gray-scale signal in response to at least one of a first latch enable signals and a second latch enable signal. The sample/hold unit may include a first transistor configured to receive the analog gray-scale signal, a first switch configured to control an electrical connection between a gate and a drain of the first transistor in response to the second clock signal, a second switch configured to apply the analog gray-scale signal to the first transistor in response to the second clock signal, a storage capacitor coupled to the gate of the first transistor and configured to charge the analog gray-scale signal, a second transistor configured to have a gate commonly coupled to the gate of the first transistor and a drain coupled to an output terminal, and a third switch configured to control an electrical connection between the drain of the second transistor and the output terminal in response to at least one of the first latch enable signal and the second latch enable signal.

In another example embodiment of the present invention, a display driving method may include converting digital display data to an analog gray-scale signal, shifting a first clock signal and outputting at least one second clock signal, performing at least one sampling/holding operation on the analog gray-scale signal in response to the second clock signal, and, outputting the first sampled/held analog gray-scale signal in response to at least one of a first latch enable signal and a second latch enable signal.

BRIEF DESCRIPTION OF THE DRAWINGS

Example embodiments of the present invention will become more apparent with the description of the detailed example embodiments thereof with reference to the attached drawings in which.

DESCRIPTION OF EXAMPLE EMBODIMENTS OF THE PRESENTION INVENTION

Figure 1:
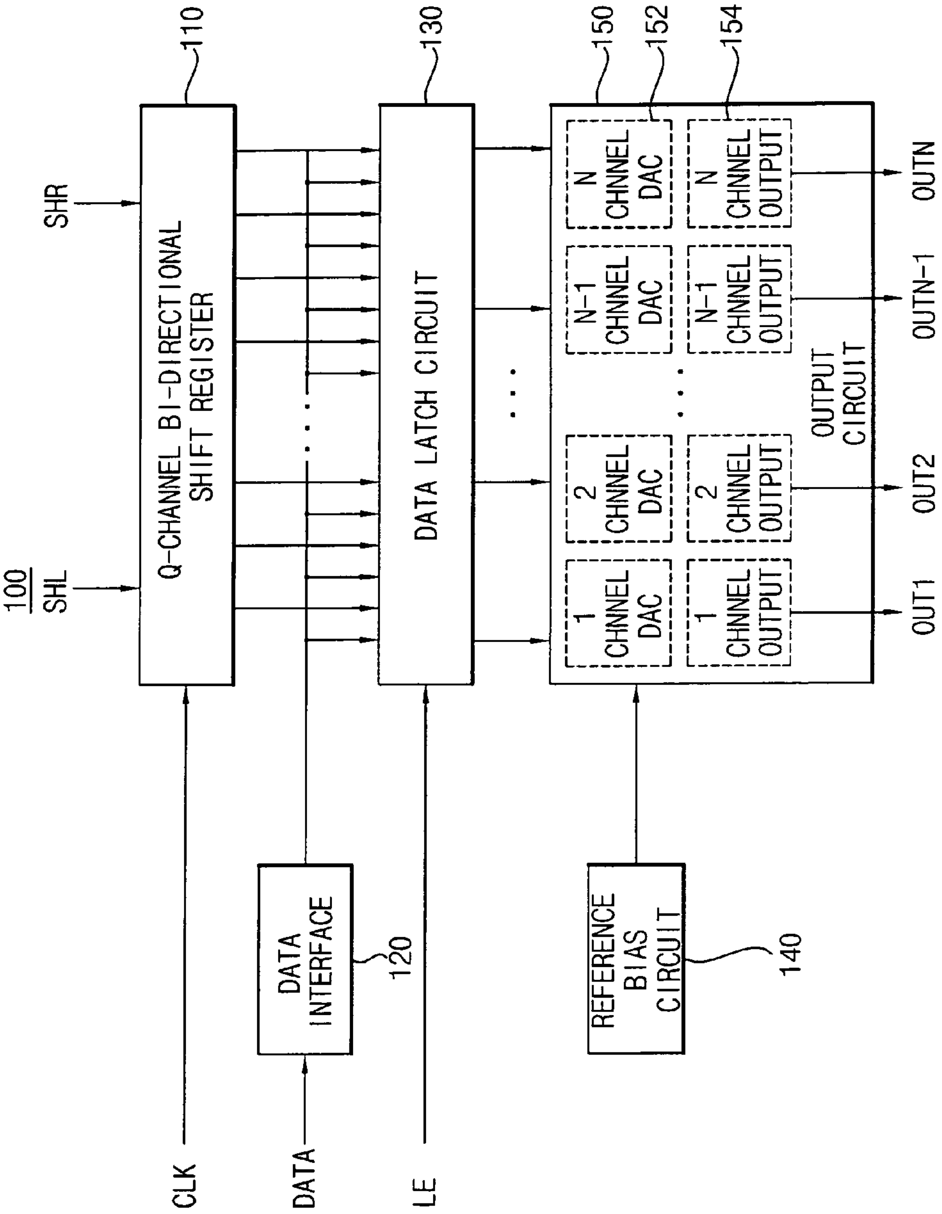
FIG. 1 (PRIOR ART)
FIG. 1 is a block diagram illustrating a conventional display driver circuit.
Figure 2:
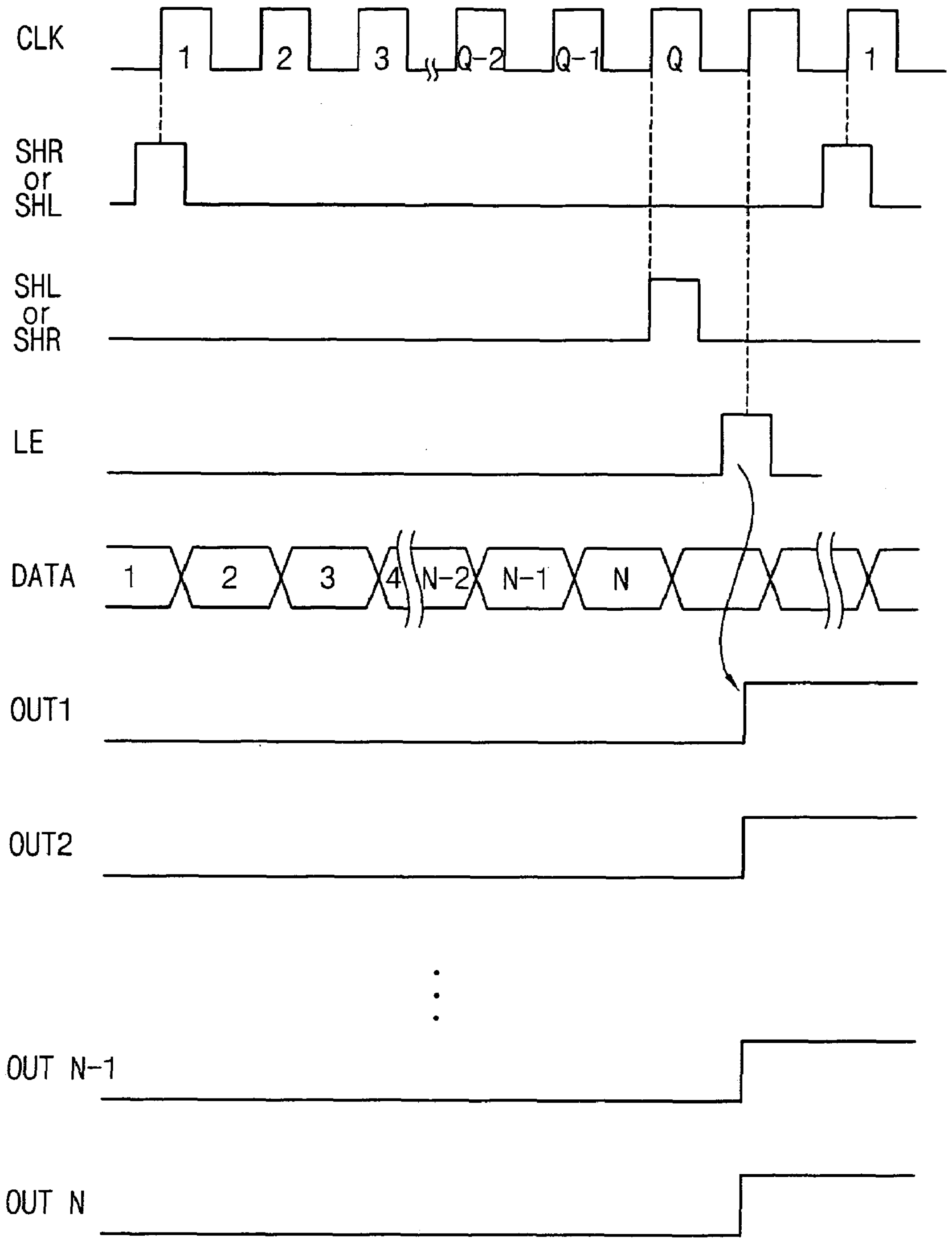
FIG. 2 (PRIOR ART)
FIG. 2 is a timing diagram to explain operations of the display driver circuit shown in FIG. 1.

Detailed illustrative example embodiments of the present invention are disclosed herein. However, specific structural and functional details disclosed herein are merely representative for purposes of describing example embodiments of the present invention. This invention may, however, be embodied in many alternate forms and should not be construed as limited to the example embodiments set forth herein.

Accordingly, while the invention may be susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
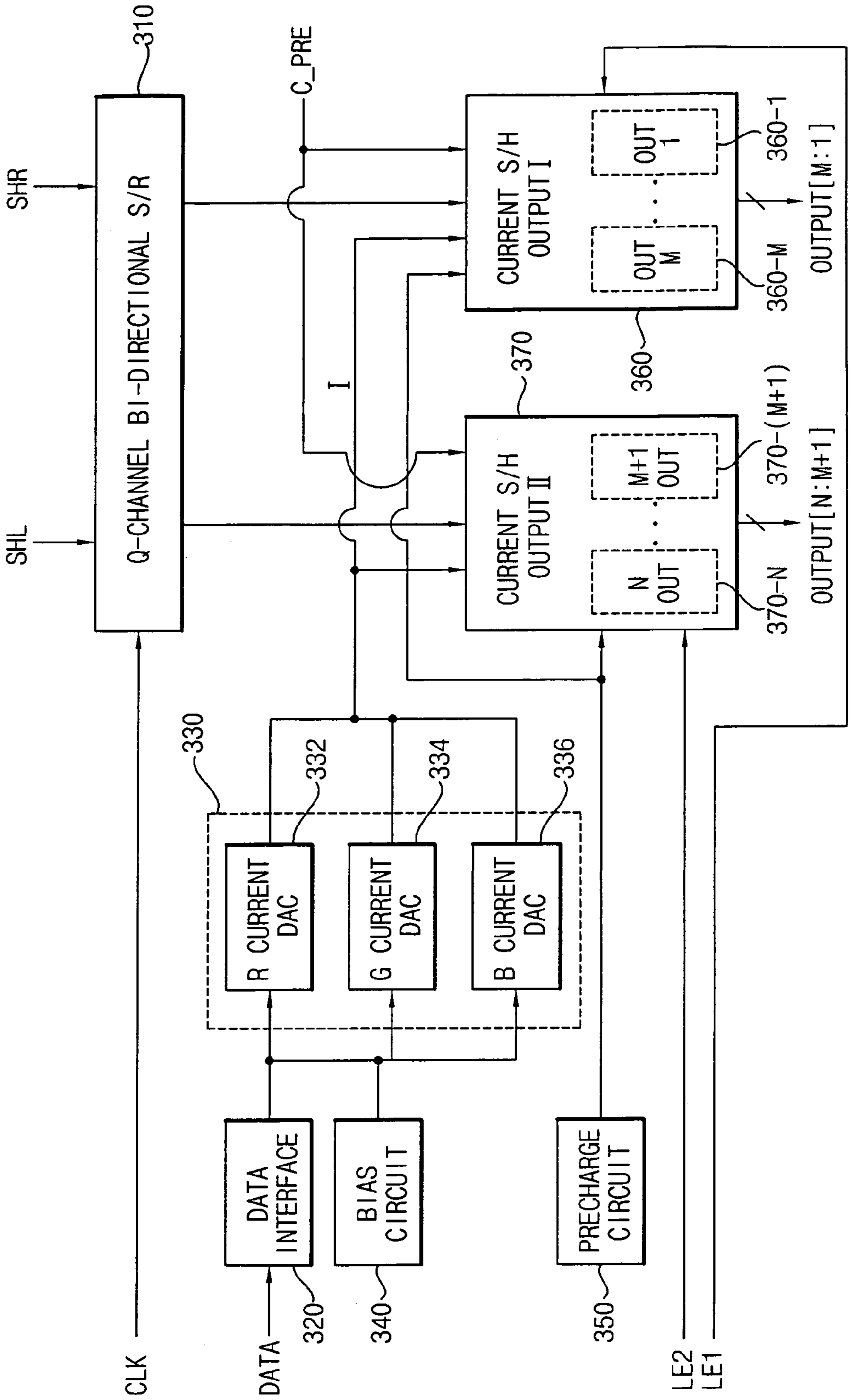
FIG. 3 is a block diagram illustrating a display driver circuit according to an example embodiment of the present invention.
Figure 4:
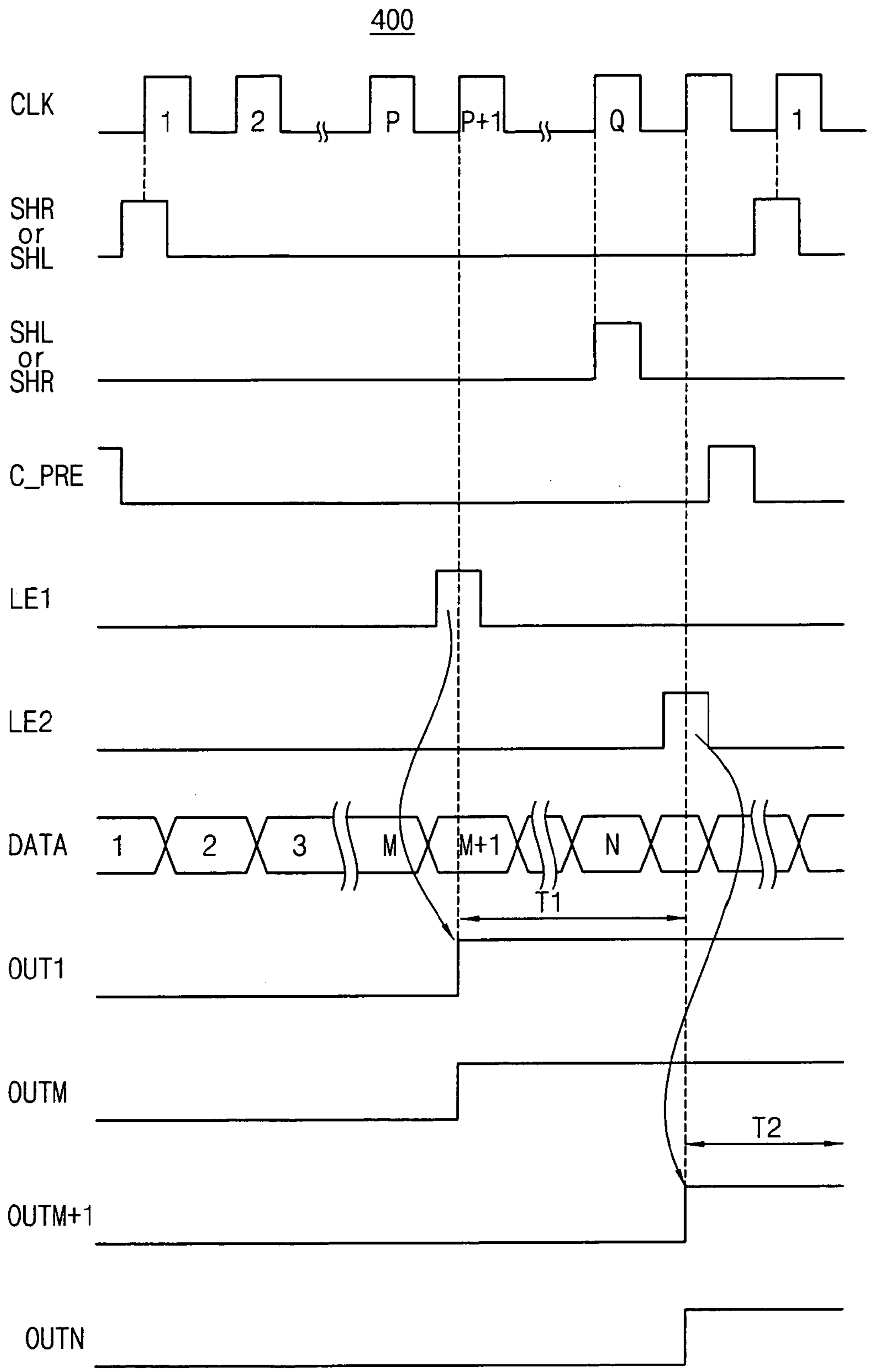
FIG. 4 is an example timing diagram to explain operations of the display driver circuit shown in FIG. 3.

FIG. 3 is a block diagram illustrating a display driver circuit according to an example embodiment of the present invention, and FIG. 4 is a timing diagram to explain operations of the display driver circuit shown in FIG. 3.

Referring to FIGS. 3 and 4, a display driver circuit may include a bidirectional shift register 310, a data interface circuit 320, a current digital-to-analog conversion unit 330, a bias circuit 340, a pre-charge circuit 350, a first current sample/hold output circuit 360, and/or a second current sample/hold output circuit 370.

The current digital-to-analog conversion unit 330 may include a red current digital-to-analog converter (DAC), a green current DAC, and a blue current DAC.

The first sample/hold output circuit 360 may include current sample/hold circuits 360-1 through 360-M, each corresponding channels 1 through M.

The second sample/hold output circuit 370 may include current sample/hold circuits 370-(M+1) through 370-N, each corresponding to channels M+1 through N.

The bidirectional shift register 310 may shift a first clock signal CLK received from an external device to sequentially output second clock signals. For example, the bidirectional shift register 310 may shift the first clock signal CLK from a left direction to a right direction in response to a left input start pulse SHL or may shift the first clock signal CLK from a right direction to a left direction in response to a right input start pulse SHR.

Output signals of the bidirectional shift register 310, for example, the second clock signals may be used as control signals of corresponding current sample/hold circuits 360-1 through 370-N.

The data interface circuit 320 may interface between a main chip (not shown) and the current digital-to-analog conversion unit 330. The current digital-to-analog conversion unit 330 may process digital display data DATA received from the main chip (not shown). For example, if the digital display data DATA is composed of 18 bits, the data interface circuit 320 may output digital gray-scale data composed of 6 bits to each of the red current DAC, green current DAC, and blue current DAC, respectively.

The current digital-to-analog conversion unit 330 according to an example embodiment of the present invention may be indirectly coupled to each of the channel output via the first/second current sample/hold output circuits 360 and 370. In addition, the current digital-to-analog conversion unit 330 may be composed of just three current DACs, instead of a number of DACs corresponding to the number of channels.

The bias circuit 340 may generate a gamma reference signal to provide a gamma reference signal to the current digital-to-analog conversion unit 330. The current digital-to-analog conversion unit 330 may convert gray-scale data provided from the data interface circuit 320 to an analog gray-scale current based on the gamma reference signal.

The first current sample/hold output circuit 360 may sample/hold the analog gray-scale current and may output output signals OUTPUT 1 through OUTPUT M to the channels 1 through M. The first current sample/hold output circuit 360 may sample/hold the analog gray-scale current from the channels 1 through M based on the output signal (or the second clock signal) of the bidirectional shift register 310.

When a first latch enable signal LE1 is activated, the sampled/held analog gray-scale current from the channels 1 through M may be output. For example, M may be N/2.

The second current sample/hold output circuit 370 may sample/hold the analog gray-scale current from the channels M+1 through N based on the output signal of the bidirectional shift register 310.

While the first current sample/hold output circuit 360 outputs the analog gray-scale current during a first time period T1, the second current sample/hold output circuit 370 may sample/hold the analog gray-scale current corresponding to the channels M+1 through N.

When the second latch enable signal LE2 is activated, the second current sample/hold output circuit 370 may output output signals OUT M+1 through OUT N to the channels M+1 through N during a second time period T2.

While the second current sample/hold output circuit 370 outputs the analog gray-scale current during the second time period T2, the first current sample/hold output circuit 360 may sample/hold the analog gray-scale current corresponding to the channels 1 through M. For example, when M is equal to N/2, the first time period T1 and the second time period T2 may be a ½ line time (½H). A 1 line time (1H) may denote a time period of a one line scanning interval.

Referring to FIG. 4, when the first latch enable signal LE1 is activated, the output signals OUTPUT 1 through OUTPUT M may be activated to be output to the channels 1 through M.

When the second latch enable signal LE2 is activated, the output signals OUTPUT M+1 through OUTPUT N may be activated to be output to the channels M+1 through N. While the output signals OUTPUT M+1 through OUTPUT N of the second current sample/hold output circuit 370 are activated, the output signals OUTPUT 1 through OUTPUT M of the first current sample/hold output circuit 360 may be inactivated. In other words, the output process of the first current sample/hold output circuit 360 and the second current sample/hold output circuit 370 may be alternately performed.

Figure 5:
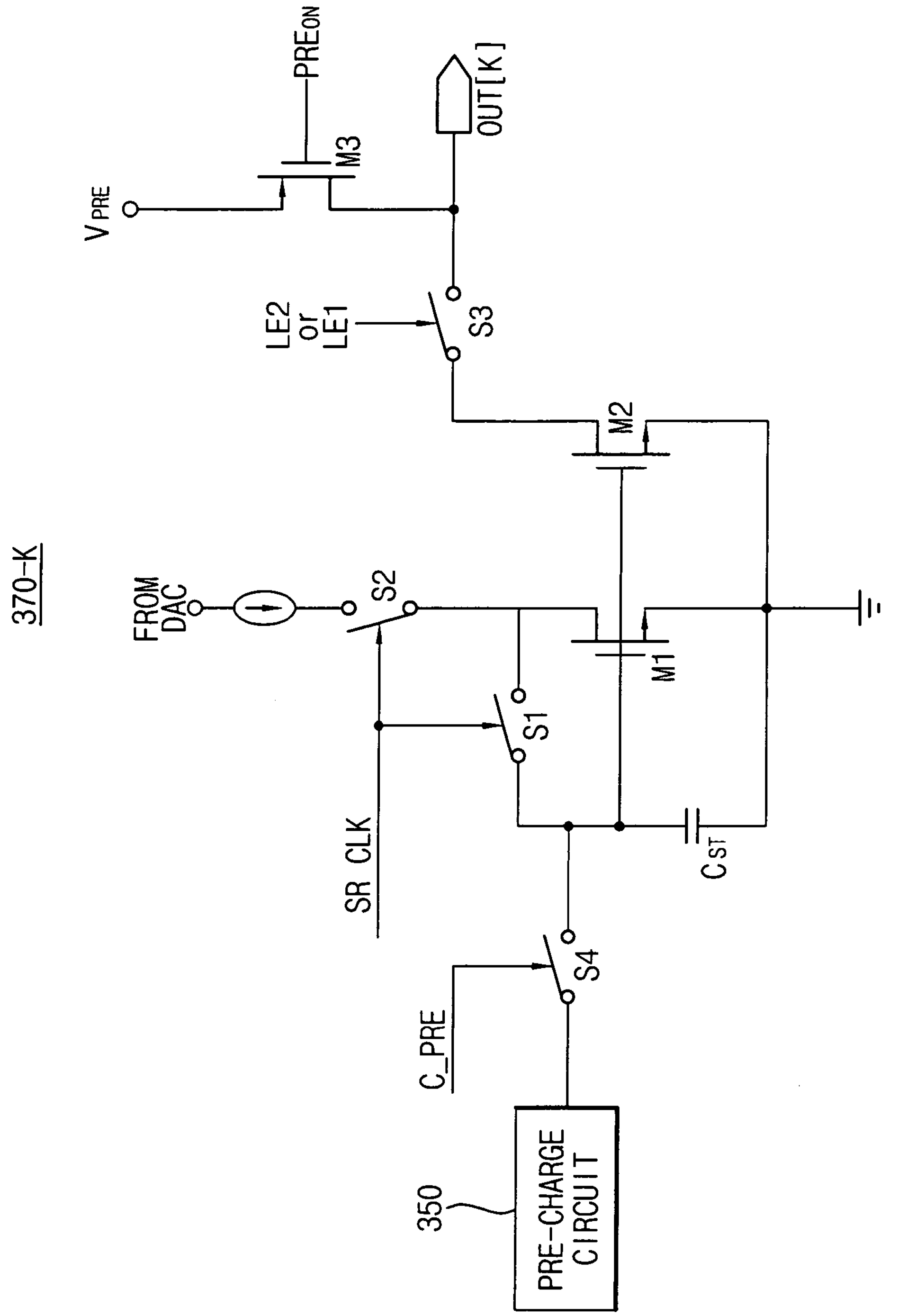
FIG. 5 is a circuit diagram illustrating a current sample/hold circuit according to an example embodiment of the present invention.

FIG. 5 is a circuit diagram illustrating a current sample/hold circuit according to an example embodiment of the present invention.

Hereinafter, operations of a current sample/hold circuit 370-k, which may correspond to a kth channel, will be described below.

Referring to FIG. 5, the current sample/hold circuit 370-k may include a first transistor M1, a second transistor M2, a third transistor M3, a first switch S1 through a fourth switch S4, and a storage capacitor CST.

When a second clock signal SR CLK, which may be an output signal of a bidirectional shift register 310 shown in FIG. 3, is activated, the first switch S1 and the second switch S2 may be turned on. As a result, an analog gray-scale current output from a current digital-to-analog conversion unit 330 may be applied to a drain of the first transistor M1 via the second switch S2. At this time, because the first switch S1 is also turned on, the analog gray-scale current applied to the drain of the first transistor M1 may be applied to a gate of the first transistor M1. The storage capacitor CST, which may be coupled to the gate of the first transistor M1, charges the analog gray-scale current.

When a second clock signal SR CLK is inactivated, the first switch S1 and the second switch S2 may be turned off; thus, the analog gray-scale current corresponding to the analog gray-scale current may be held in the storage capacitor CST.

When the first latch enable signal LE1 or the second latch enable signal LE2 is activated, a third switch S3 may couple a drain of the second transistor M2 to an output terminal OUT[K], and the second transistor M2, which may have its gate coupled to the storage capacitor CST, may output the analog gray-scale current to the output terminal OUT[K] based on the charged analog gray-scale current.

An analog gray-scale current used for representing a gray level, which may correspond to a minimum size DAC unit, may be about several tens of nA, therefore, may require a relative long charge time to charge the storage capacitor CST.

In order to reduce the charge time, a current, N times higher than a minimum output current of the current DAC, may be supplied to the first transistor M1.

In order to output desired output signals at the output terminal OUT[K], the first transistor M1 and the second transistor M2 may have a size ratio of N:1 using a current mirror configuration.

To further reduce a charge time, a fourth switch S4 may be turned on to pre-charge a voltage of the storage capacitor CST to a voltage level slightly lower than a threshold voltage of the first transistor M1 in response to the capacitor pre-charge signal C_PRE before the first switch S1 and the second switch S2 are turned on.

The output terminal OUT[K] may be used to drive a display panel (not shown) using a smaller current. The output terminal OUT[K] may be pre-charged, which may be implemented using the third transistor M3, to quickly provide display data to a display panel (not shown). In other words, the third transistor M3 may be turned on to pre-charge the output terminal OUT[K] with a pre-charge voltage VPRE in response to an output pre-charge signal PREON before the output signals are applied to the output terminal OUT[K].

The display driver circuit according to example embodiments of the present invention may be applicable to Organic Light Emitting Diode (OLED) display devices, for example, current-driven active matrix type OLED display devices.

Additionally, a panel driven method, for example, output terminals shown in FIG. 3, which may be divided into two blocks, may be applicable to active matrix type liquid crystal display devices. For example, when output terminals shown in FIG. 3 are applicable to voltage-driven active matrix type liquid crystal display devices instead of current-driven devices, a digital-to-analog converter (DAC) may be substituted for a digital-to-analog conversion unit 330 shown in FIG. 3, and an output buffer may be substituted for first and second sample/hold output circuits 360 and 370.

As described above, a display driver circuit and a display driving method may divide output terminals into two blocks and couple a current digital-to-analog conversion unit to an output terminal of an data interface circuit; therefore, an increase of chip area, due to an increase of number of channels and high definition requirements, may be reduced. In addition, the current sample/hold circuit may perform a sampling operation faster, and may more accurately output output signals to corresponding channels.

While example embodiments of the present invention and aspects thereof have been described in detail, it should be understood that various changes, substitutions and alterations may be made herein without departing from the scope of the example embodiments of the present invention.

What is claimed is:

1. A display driver circuit, comprising:

a shift register configured to shift a first clock signal to generate at least one second clock signal;

a digital-to-analog conversion unit configured to convert digital gray-scale data to an analog gray-scale signal;

a first sample/hold output circuit configured to sample/hold the analog gray-scale signal in response to the at least one second clock signal, and configured to provide the sampled/hold analog gray-scale signal to a plurality of first channels in response to a first latch enable signal; and a second sample/hold output circuit configured to sample/hold the analog gray-scale signal in response to the at least one second clock signal, and configured to provide the sample/hold analog gray-scale signal to a plurality of second channels in response to a second latch enable signal.

2. The display driver circuit of claim 1, further including a bias circuit configured to generate a gamma reference signal, wherein the digital-to-analog conversion unit converts the digital gray-scale data to the analog gray-scale signal based on the gamma reference signal.

3. The display driver circuit of claim 2, wherein the digital-to-analog conversion unit includes:

a first digital-to-analog converter (DAC) configured to convert a digital red gray-scale data to a first analog gray-scale signal based on the gamma reference signal;

a second digital-to-analog converter (DAC) configured to convert a digital green gray-scale data to a second analog gray-scale signal based on the gamma reference signal; and a third digital-to-analog converter (DAC) configured to convert a digital blue gray-scale data to a third analog gray-scale signal based on the gamma reference signal.

4. The display driver circuit of claim 1, wherein the shift register includes a bidirectional shift register configured to shift the first clock signal to a first direction in response to a first input start pulse and shift the first clock signal to a second direction in response to a second input start pulse, and sequentially generate the at least one second clock signal.

5. The display driver circuit of claim 4, wherein the bidirectional shift register includes a multiple channel bidirectional shift register configured to output the at least one second clock signal so as to simultaneously control the plurality of first and second channels.

6. The display driver circuit of claim 1, wherein the second sample/hold output circuit is configured to perform a sample/hold operation when the first sample/hold output circuit outputs the analog gray-scale signals, and the first sample/hold output circuit is configured to perform the sample/hold operation when the second sample/hold output circuit outputs the analog gray-scale signals.

7. The display driver circuit of claim 1, wherein the first sample/hold output circuit is configured to output the analog gray-scale signals in response to the first latch enable signal at a first ½ line time, and the second sample/hold output circuit is configured to output the analog gray-scale signals in response to the second latch enable signal at a second ½ line time.

8. The display driver circuit of claim 1, wherein each of the first and the second sample/hold output circuits include a sample/hold unit configured to receive the analog gray-scale signal in response to the second clock signal, and adapted to output the analog gray-scale signal in response to at least one of the first and second latch enable signals.

9. The display driver circuit of claim 8, wherein the sample/hold unit includes:

a first transistor configured to receive the analog gray-scale signal;

a first switch configured to control an electrical connection between a gate and a drain of the first transistor in response to the second clock signal;

a second switch configured to apply the analog gray-scale signal to the first transistor in response to the second clock signal;

a storage capacitor coupled to the gate of the first transistor and configured to charge the analog gray-scale signal;

a second transistor configured to have a gate commonly coupled to the gate of the first transistor, and a drain coupled to an output terminal; and a third switch configured to control an electrical connection between the drain of the second transistor and the output terminal in response to at least one of the first latch enable signal and the second latch enable signal.

10. The display driver circuit of claim 9, wherein the sample/hold unit further includes a fourth switch configured to have one end commonly coupled to the storage capacitor, the gate of the first transistor, and the first switch, and having the other end coupled to a pre-charge circuit, and the fourth switch further configured to pre-charge the storage capacitor in response to a capacitor pre-charge signal.

11. The display driver circuit of claim 10, wherein each of the first and the second sample/hold output circuits further includes a third transistor configured to pre-charge the output terminal, and having a drain coupled to the output terminal, a source coupled to a pre-charge voltage, and a gate coupled to an output pre-charge signal.

12. The display driver circuit of claim 9, wherein each of the first and the second sample/hold output circuits further includes a pre-charge circuit configured to provide a pre-charge voltage to the first and the second sample/hold output circuits.

13. A current sample/hold circuit, comprising:

a sample/hold unit configured to receive an analog gray-scale signal in response to a clock signal, and adapted to output the analog gray-scale signal in response to at least one of a first latch enable signal and a second latch enable signal.

14. The current sample/hold circuit of claim 13, the sample/hold unit including:

a first transistor configured to receive the analog gray-scale signal;

a first switch configured to control an electrical connection between a gate and a drain of the first transistor in response to the clock signal;

a second switch configured to apply the analog gray-scale signal to the first transistor in response to the clock signal;

a storage capacitor coupled to the gate of the first transistor and configured to charge the analog gray-scale signal;

a second transistor configured to have a gate commonly coupled to the gate of the first transistor, and a drain coupled to an output terminal; and a third switch configured to control an electrical connection between the drain of the second transistor and the output terminal in response to at least one of the first latch enable signal and the second latch enable signal.

15. The current sample/hold circuit of claim 14, the sample/hold unit further including a fourth switch configured to have one end commonly coupled to the storage capacitor, the gate of the first transistor, and the first switch, and having the other end coupled to a pre-charge circuit, and the fourth switch further configured to pre-charge the storage capacitor in response to a capacitor pre-charge signal.

16. The current sample/hold circuit of claim 14, the sample/hold unit further including a third transistor configured to pre-charge the output terminal, and having a drain coupled to the output terminal, a source coupled to a pre-charge voltage, and a gate coupled to an output pre-charge signal.

17. The current sample/hold circuit of claim 16, wherein the first transistor and the second transistor are NMOS transistors, and the third transistor is a PMOS transistor.

18. A display driving method, comprising:

converting digital display data to an analog gray-scale signal;

shifting a first clock signal and outputting at least one second clock signal;

performing at least one sampling/holding operation on the analog gray-scale signal in response to the second clock signal; and, outputting the sampled/held analog gray-scale signal in response to at least one of a first latch enable signal and a second latch enable signal.

19. The display driving method of claim 18, wherein converting the digital display data includes:

converting digital red gray-scale data to a first analog gray-scale signal;

converting digital green gray-scale data to a second analog gray-scale signal; and converting digital blue gray-scale data to a third analog gray-scale signal.

20. The display driving method of claim 18, wherein performing the at least one sampling/holding operation includes charging the analog gray-scale signal.

21. The display driving method of claim 18, wherein a first outputting of the sampled/held analog gray-scale signal is performed substantially at a time a second sampling/holding is performed on another analog gray-scale signal.

22. The display driving method of claim 21, wherein a second outputting of the sampled/held analog gray-scale signal is performed substantially at a time the first sampling/holding is performed on another analog gray-scale signal.

* * * * *